United States Patent [19]

Birchall

[11] 4,157,510
[45] Jun. 5, 1979

[54] ELECTRONIC INSTRUMENT AMPLIFIER

[76] Inventor: Donald J. Birchall, c/o D. J. Birchall Limited, Finchley Ave., Industrial Estate, Mildenhall, Suffolk, England

[21] Appl. No.: 852,967

[22] Filed: Nov. 18, 1977

[30] Foreign Application Priority Data

Nov. 18, 1976 [GB] United Kingdom ............... 48214/76

[51] Int. Cl.² ............................................ H03F 3/60
[52] U.S. Cl. ...................................... 330/53; 310/318; 330/57
[58] Field of Search ................... 310/318, 319; 330/53, 330/57

[56] References Cited

U.S. PATENT DOCUMENTS

| Re. 28,596 | 10/1975 | Siegel | 310/319 |
| 2,252,613 | 8/1941 | Bingley | 330/53 |

Primary Examiner—Lawrence J. Dahl
Attorney, Agent, or Firm—Wenderoth, Lind & Ponack

[57] ABSTRACT

The amplifier is intended for use in situations where a considerable distance separates the instrument (for example a piezo-electric transducer) to be monitored and the control room. The amplifier comprises a charge/current converter for converting the charge output of the instrument into a current signal, the charge/current converter being connected to operate as a high impedance current source, a current/voltage converter and a connecting cable connecting the current output of the charge current converter to the input of the current/voltage converter.

5 Claims, 2 Drawing Figures

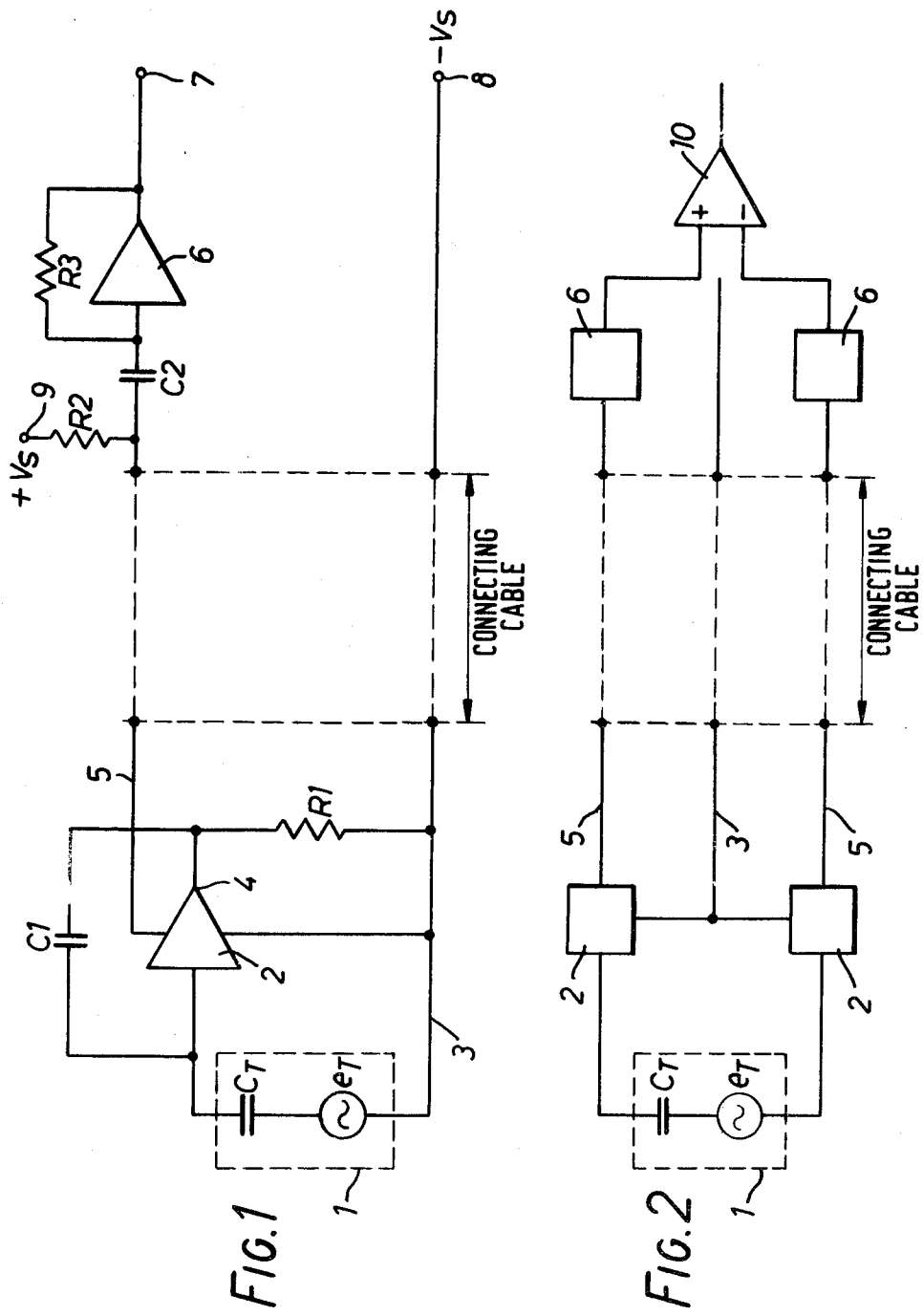

ELECTRONIC INSTRUMENT AMPLIFIER

This invention relates to electronic instrument amplifiers. The invention is particularly, although not exclusively, concerned with amplifiers for amplifying the output signals from piezo-electric transducers used, for example, for vibration detection.

In such transducers used for monitoring vibration in machines, it is frequently the case that transducers mounted on machines distributed about a factory are located several hundred meters from the central control room in which the information from the transducers is processed. It is therefore necessary to provide long cable connections between the transducers and the central control room and the system, as a result, suffers from a poor signal to noise ratio due to pick up of electrical interference and noise in the connecting cable. The degree of such interference is a function of the length of the connecting cable and the general character of the electrical load of the plant.

The present invention is concerned with an instrument amplifier which reduces the effect of such interference or noise to an acceptable level. To date anti-interference precautions in the use of piezo-electric transducers range from simple electrical isolation of the transducer by mounting the transducer on a pad of insulating material through transmitting the output signal from the transducer as a differential signal, to the use of a voltage follower amplifier local to the transducer.

According to the invention, there is provided an electronic instrument amplifier for amplifying the output from an electronic instrument, this amplifier comprising a charge/current converter local to the instrument for converting the charge output of the instrument into a current signal whose magnitude is directly proportional to the charge output of the instrument, a current/voltage converter for converting the current output of the charge/current converter into a voltage signal whose magnitude is proportional to the magnitude of the current signal, and an electrical cable linking the output of the charge/current converter to the imput of the current/voltage converter.

The amplifier is intended for use in situations where a considerable distance separates the two parts of the amplifier (i.e. charge/current converter and current/voltage converter). The current/voltage converter can thus be situated remote from the instrument, for example in a central control room.

The effect of the charge/current converter will now be illustrated by way of the following example:

A piezo-electric transducer connected directly to a charge amplifier would generate a current of $\omega Q_T$ amps, where $\omega$ is the angular frequency and $Q_T$ is the charge generated by the transducer. $Q_T$ is equal to the product of $1_T$ and $C_T$, where $1_T$ is the output e.m.f. of the transducer and $C_T$ the capacitance of the transducer.

If the output of the transducer is now passed to a charge/current converter having a conversion gain of, say, 1 microampere/picocoulomb, the total current gain would be 70 dB at a frequency of 50 Hz. Because this amplification takes place before the signal enters the connection cable, the signal/noise ratio of the whole system at 50 Hz can be improved by 70 dB as compared with no pre-cable amplifier at all. This improvement in signal/noise ratio increases for lower frequency interference components and reduces for higher frequency interference components at a rate of 6 dB/octave.

The use of a charge amplifier to amplify the output from a piezo-electric transducer is preferred to the use of a voltage amplifier. The reason for this is that most piezo-electric materials commonly used for such transducers exhibit a much smaller charge sensitivity variation with temperature, than voltage sensitivity over the same temperature range. For example PZT5A lead zirconate titanate piezo-electric ceramic exhibits a charge sensitivity variation of 15% over the range $-50°$ to $+250°$ C., whereas the voltage sensitivity may vary by perhaps 100% over the same range.

In a preferred embodiment of the invention, the input of the current/voltage converter is at virtual ground potential, and is a.c. coupled to the output of the charge/current converter.

Also in a preferred embodiment of the invention, the charge/current converter comprises a differential amplifier having a single-ended load, and wherein the output signal from the converter is a.c. coupled from one of the d.c. supply lines which supply d.c. power to the differential amplifier. Since the output signal current in the d.c. supply lines is not a function of the load, the a.c. output impedance of the charge/current converter is high and the charge/current converter thus acts as a high-impedance current source.

The differential amplifier may be an integrated circuit operational amplifier. In this arrangement, the output signal of the charge/current converter is taken along the same line as one of the d.c. power supplies, thus enabling a two-wire connecting cable to provide all the necessary connections for the converter and transducer. This cable may be twin conductor shielded cable, with the shield braiding connected to ground to reduce pick up of interference.

In order that the invention may be better understood, an embodiment thereof will now be described by way of example only and with reference to the accompanying drawings in which:

FIG. 1 is a schematic circuit diagram of one embodiment of an electronic instrument amplifier according to the invention; and FIG. 2 is a block schematic diagram showing two amplifiers such as shown in FIG. 1, used in differential configuration.

It should be noted that the drawings are schematic, and show only those parts of the circuit which are necessary for explaining the present invention. Detail such as bias networks has been omitted for clarity.

Referring to FIG. 1, the amplifier is shown connected to an instrument in the form of a piezo-electric transducer 1, represented by a voltage generator $1_T$ and capacitor $C_T$. The charge output from the transducer is given by:

$$Q_T = 1_T C_T$$

The transducer is connected between the inverting input of an integrated circuit differential amplifier 2 and a negative power supply line 3. A single-ended load comprising resistor R1 is connected between the output terminal 4 of the amplifier 2 and the line 3. The positive power supply to the amplifier 2 is taken via a line 5.

The amplifier 2 has an integrating action, provided by a feedback capacitor C1 connected between the ouput terminal 4 and the inverting input of the amplifier. The capacitor C1 forms a potential divider with capacitor $C_T$ and results in a virtual ground potential at the input of amplifier 2. The voltage gain of amplifier 2 is given by Gain = $C_T/C1$ Since the input voltage is $1_T$, the output volgage across resistor R1 is $1_T C_T/C1$, which can itself be simplified to $Q_T/C1$. From this latter, it will be seen that the amplifier 2 supplies an output voltage whose magnitude is $Q_T$ times the reciprocal of C1. Hence amplifier 2 acts as a charge amplifier. Output signal current $i_o$ flowing in resistor R1 is given by:

$$i_o = \frac{Q_T}{C1 \cdot R1} \alpha \frac{1_T}{R1}$$

The effect of the virtual ground potential at the input of amplifier 2 is to considerably reduce the effects of cable capacitance or resistance in the cable connection between the transducer 1 and amplifier 2. This has been found to enable very considerable lengths of cable to be used without degradation of the high frequency response of the signal being transmitted.

Due to the fact that the load is single-ended, all other stages in amplifier 2 being differential, the output current $i_o$ also appears on the negative and positive supply lines 3 and 5. If, therefore, one of the supply lines, in this case the positive supply line 5, is deliberately not decoupled, then the output signal $i_o$ will be superimposed on the d.c. supply current on this line and it will be possible to pick off this signal at any point along the length of the line. It will be appreciated that the ability to superimpose the $i_o$ signal onto the d.c. supply signal relies on the fact that all earlier stages in the amplifier 2 are of the differential type. The output from a differential stage is taken from two points in the circuit which are separated from either of the power supply lines rather than, as in a single-ended stage, the output being taken between a point in the circuit and one of the power supply lines. Since in a differential amplifier the output signal of each stage does not appear on either of the supply lines, it is not necessary to decouple the lines to prevent interaction between stages.

The power supply lines 3 and 5 are taken via a connecting cable to a remote point. The signal current $i_o$ is tapped off the positive line 5 by means of a capacitor C2 and is connected to the inverting input of a further integrated circuit differential amplifier 6. Amplifier 6 is a high gain type with a feedback resistor R3 connected between its output terminal 7 and input. As a result of this arrangement, the input of the amplifier 6 is at virtual ground potential, and therefore the positive supply line 5 is also at virtual ground potential, at least as regards signal frequencies. The output voltage $1_o$ of amplifier 6 is equal to the product of $i_o$ and the feedback resistor R3.

Since the output signal current $i_o$ is thus at virtual ground potential, the high frequency attenuating effect of a long and hence high capacitance connecting cable is reduced to negligible proportions. In addition the sensitivity of the charge/current amplifier 2 is virtually unaffected by the capacitance and leakage resistance of the connecting lead, or by the leakage resistance of the transducer itself.

D.C. power for the amplifier 2 is supplied between terminals 8 and 9. The negative supply terminal 8 connects via the connecting cable to the line 3, while the positive supply terminal 9 connects via a resistor R2 to the line 5. The resistor R2 acts to ensure that the signal $i_o$ is not lost to the power supply. For the sake of convenience, the value of resistor R2 is such that the d.c. potential on line 5 is approximately zero, although this is not essential, and other values could be used.

The amplifier described with reference to FIG. 1 is capable of extension to a differential system with enhanced rejection of common mode interference. Such an amplifier is shown in FIG. 2 in which the same reference numerals have been used where appropriate. The output signals from the two amplifiers 6 are combined in a difference amplifier 10 which gives an output proportional to the difference between the output voltage from the two amplifiers 6. Such a differential system is able to enhance common mode rejection by up to 80 dB at a frequency of 50 Hz.

The amplifier described above may be mounted within its own housing adjacent to the transducer. However, the amplifier can be miniaturised to such an extent that it is easily possible to build the amplifier into the actual transducer housing itself, thus saving space.

I claim:

1. An electronic instrument amplifier for amplifying the output from a piezo-electric ceramic transducer comprising: a charge/current converter local to the transducer having an amplifier means having input and output terminals and first and second voltage supply terminals, a load resistor connected between said output terminal and said first voltage supply terminal and a feedback capacitor connected between said output terminal and said input terminal; means for connecting the piezo-electric ceramic transducer between the input terminal of said amplifier means and said first voltage supply terminal, whereby said charge/current converter converts the charge output of the transducer into a current signal at said second voltage supply terminal having a magnitude directly proportional to the charge output of the transducer; a two-conductor electrical cable connected to respective voltage supply terminals to said amplifier means; and a current/voltage converter connected to said two-conductor electrical cable for converting the current output of said charge/current converter into a voltage signal whose magnitude is proportional to the magnitude of said current signal having an input terminal capacitively connected to that conductor of said electric cable which is connected to said second voltage supply terminal to thereby receive said current signal.

2. An electronic instrument amplifier according to claim 1 wherein the input of the current/voltage converter is at virtual ground potential.

3. An electronic instrument amplifier according to claim 1 wherein said amplifier means is a differential amplifier having a single ended load.

4. An electronic instrument amplifier for amplifying the output from a piezo-electric ceramic transducer comprising: a charge/current converter means local to the transducer including first and second charge/current converters each having amplifier means having input and output terminals and first and second voltage terminals, said first voltage terminals being connected in common, a load resistor connected between said output terminal and said first voltage terminal of said amplifier means, a feedback capacitor connected between said output terminal and input terminal of said amplifier means; means for connecting the piezo-electric ceramic transducer between said input terminals of said amplifier means, whereby said charge/current converter means converts the charge output of the transducer into current signals directly proportional to the charge output to the transducer; a current/voltage converter means including a first and second current/voltage converter each having a capacitively coupled input terminal and an output terminal and a differential amplifier having two inputs connected to said output terminals of respective current/voltage converters; and an electrical cable means for connecting said second voltage terminals to said input terminals of respective current/voltage converters.

5. An electronic instrument amplifier as claimed in claim 4 wherein said electrical cables means comprises a three-conductor electrical cable having a first conductor connected to said second voltage terminal of said amplifier means of said first charge/current converter and said input terminal of said first current/voltage converter, a second conductor connected to said second voltage terminal of said amplifier means of said second charge/current converter and said input terminal of said second current/voltage converter and a third conductor connected to said common connection of said first voltage terminals and adapted for connection to a voltage source.

* * * * *